United States Patent [19]

Dingwall

[11] 3,870,966

[45] Mar. 11, 1975

[54] COMPLEMENTARY FIELD EFFECT TRANSISTOR DIFFERENTIAL AMPLIFIER

[75] Inventor: Andrew Gordon Francis Dingwall, Somerville, N.J.

[73] Assignee: RCA Corporation, New York, N.Y.

[22] Filed: June 1, 1973

[21] Appl. No.: 365,836

[52] U.S. Cl. .................... 330/30 D, 330/13, 330/17, 330/35, 330/38 M

[51] Int. Cl. .................... H03f 3/68

[58] Field of Search .......... 307/304; 330/13, 15, 17, 330/22, 30 D, 35, 38 M

[56] References Cited

UNITED STATES PATENTS 3,392,341 7/1968 Burns .................... 330/13

3,676,702 7/1972 McGrogan, Jr. .............. 307/304 X

*Primary Examiner*—R. V. Rolinec

*Assistant Examiner*—Lawrence J. Dahl

*Attorney, Agent, or Firm*—H. Christoffersen; S. Cohen

[57] ABSTRACT

A differential amplifier includes a pair of complementary symmetry field-effect transistor amplifiers. A variable impedance circuit provides a common set of operating potentials to the amplifiers and translates the operating potentials in accordance with output signals produced by both of the amplifiers in a sense to maximize the voltage gain of the amplifiers over a desired common-mode input voltage range.

17 Claims, 6 Drawing Figures

COMPLEMENTARY FIELD EFFECT TRANSISTOR DIFFERENTIAL AMPLIFIER

This invention relates to amplifiers, and, in particular, to differential amplifiers employing complementary field-effect transistors (FET's).

The term differential amplifier as used here refers to that class of amplifiers which produces an output signal representative of the difference of two input signals applied to the amplifier. Uses for such amplifiers are well known.

Prior art differential amplifiers customarily employ bipolar transistors as principal amplifying elements because of the relatively high transconductance characteristic of such transistors. On the other hand, bipolar transistors have a disadvantage in being essentially current operated devices having a relatively low input impedance and, in addition, produce an output noise spectrum characterized by substantial amounts of $1/f$ noise due current flow through a semiconductor junction within the transistor. The term $1/f$ is generally used to designate low frequency noise, the amplitude of which increases with decreasing frequency. This noise component typically dominates the noise power spectrum of bipolar transistors in the infrasonic region. Field effect transistors, however, are essentially voltage operated devices and so inherently provide high input impedance and are additionally characterized in having low $1/f$ noise.

Some prior art differential amplifiers employ a hybrid design including both bipolar and field effect transistors to obtain the advantages of both technologies. The price which is paid is complex circuit design and additional manufacturing steps required to accommodate the technologies of both kinds of devices in, for example, an integrated circuit.

A need exists for a differential amplifier employing field effect transistors to realize the advantages of structural simplicity and inherently high input impedance characteristic of such devices. Prior art amplifiers employing field-effect transistors are generally of two kinds. One kind involves the use of pairs of transistors of a single conductivity type where some of the transistors are used as active amplifying elements and other of the transistors are connected to operate in the manner of passive load elements. The second kind of amplifier, employs pairs of complementary transistors where each transistor serves, in a manner of speaking, as an active load element for its associated complementary transistor. This results in substantially higher amplification factors on a per-stage basis than the former approach. A need exists for a differential amplifier employing complementary transistors to obtain the advantage of the high amplification factor inherent in the complementary configuration.

A number of problems must be overcome, however, to achieve differential amplification of two input signals when utilizing a complementary field effect transistor amplifier. These problems principally relate to biasing and signal summation in the presence of common-mode input voltages.

The biasing problem arises because prior art complementary symmetry field-effect transistor amplifiers are characterized in having a relatively narrow region of their input/output transfer functions over which the output voltage changes appreciably for a given change in the input voltage. Further, this relatively narrow region is subject to relatively wide variations on a unit-to-unit basis which makes such amplifiers difficult to bias for maximum voltage gain.

The two principal factors which contribute to variations in the transfer function of a complementary field-effect transistor amplifier are tha manufacturing process used to make the amplifier and the environmental conditions that the amplifier is subject to when in operation. Unit-to-unit variations in the manufacturing process are caused by a large number of variables such as geometry differences, mobility differences and so on. Examples of environmental variables which affect the transfer function are absolute temperatures, temperature gradients and various forms of radiation such as electrostatic, electromagnetic and nuclear radiation. Environmental effects are particularly difficult to compensate for, because the complementary transistors which form the amplifier generally do not respond in the same way to identical temperature changes or identical radiation changes.

A conventional approach to biasing such an amplifier is to provide a feedback path from the output terminal to the input terminal of the amplifier which establishes self-bias by means of the negative feedback action produced. The self-biasing technique, however, degrades the input impedance of the amplifier, requires alternating-current coupling of the input signal to the amplifier, results in a loss of gain due to the presence of the negative feedback and requires use of a feedback element such as resistive element which further complicates the design.

The biasing problem of a complementary field-effect transistor amplifier becomes severe when a number of such amplifiers are interconnected to perform the function of a differential amplifier and becomes particularly severe when the differential amplifier is subjected to widely varying common-mode input voltages.

A need exists for a complementary field-effect transistor amplifier which can be easily fabricated as an integrated circuit without employing resistors. It would be particularly desirable if such an amplifier could be biased in a manner to provide compensation for variations in its transfer function without employing feedback elements between its input and output terminals. Moreover, a complementary FET amplifier is needed which is capable of differential amplification of a pair of input signals while rejecting common mode voltages present in each of the input signals over a wide common-mode input voltage range.

The preferred embodiments of the present invention include a pair of complementary symmetry field-effect transistor amplifiers. Each amplifier is biased to an operating point in the substantially linear portion of its operating region in response to common-mode voltage components present in the input signals supplied to each amplifier and a common set of operating potentials also supplied to the amplifiers. The common operating potentials for the amplifiers are provided by a variable impedance circuit responsive to output signals produced by both of the amplifiers.

The invention is illustrated in the accompanying drawings, of which:

Figure 3:
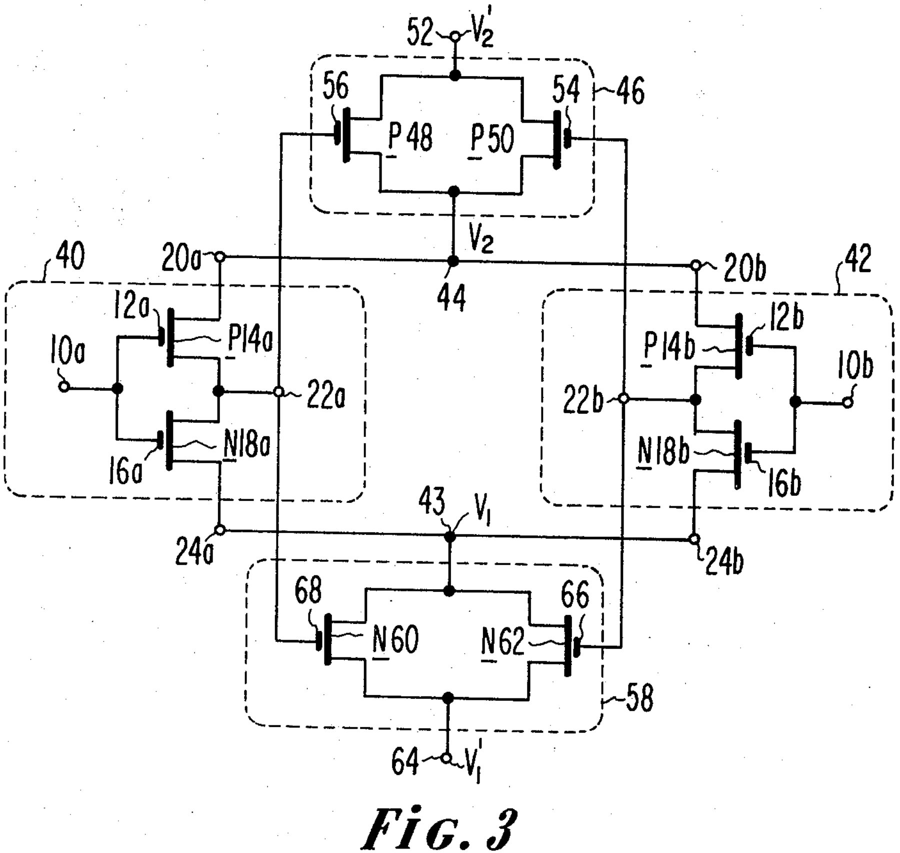
FIG. 3 is a circuit diagram of a differential amplifier embodying the invention.
Figure 3A:
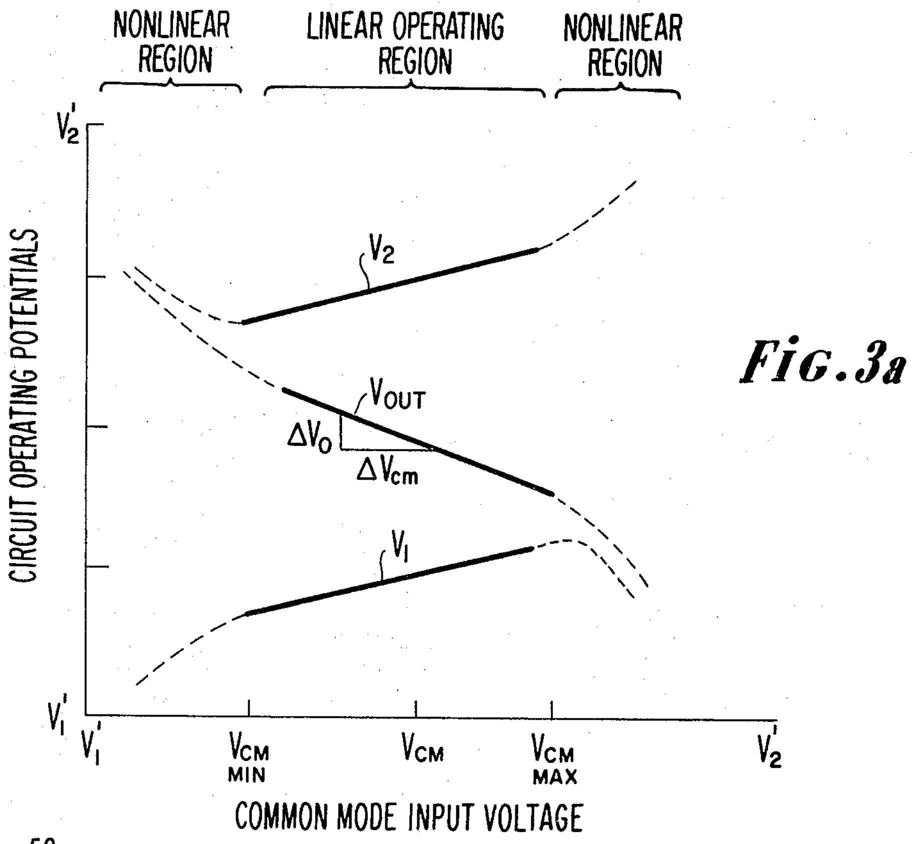

FIG. 3*a* illustrates circuit potential relationships of the amplifier of FIG. 3.

Figure 4:
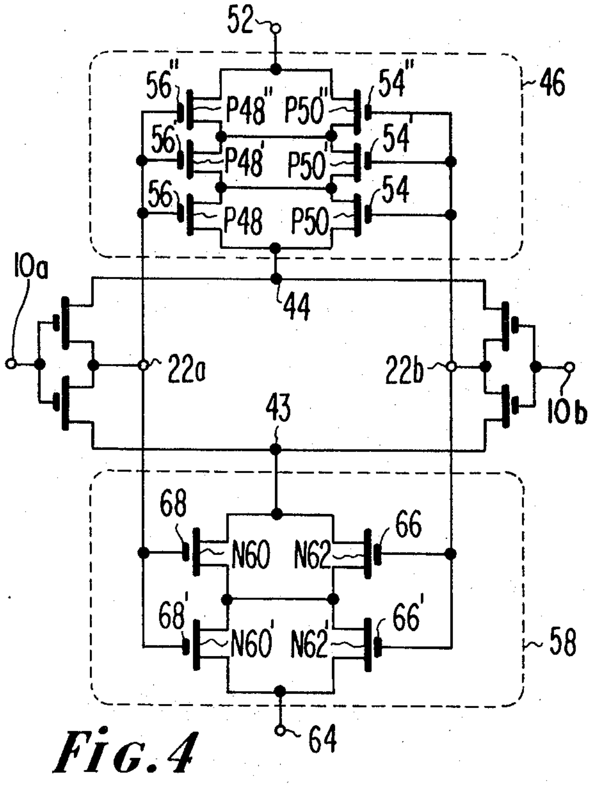

FIG. 4 illustrates a modification of the circuit of FIG. 3.

Figure 5:
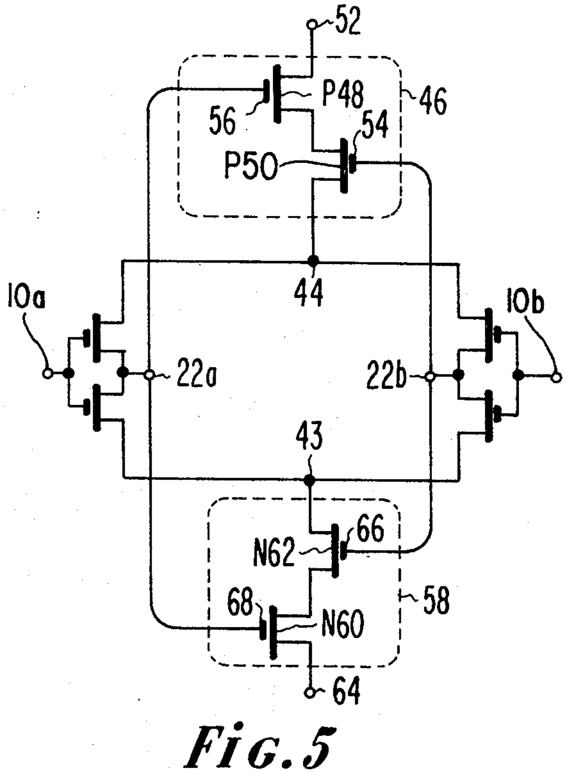

FIG. 5 illustrates another modification of the circuit of FIG. 3.

Figure 1:
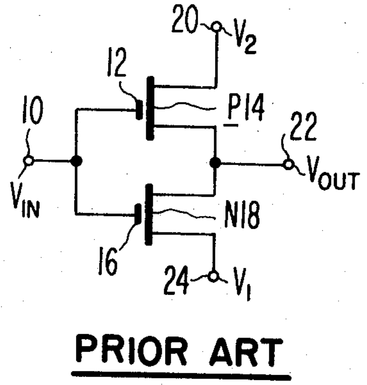
PRIOR ART FIG. 1
FIG. 1 is a circuit diagram of a prior art complementary symmetry field-effect transistor amplifier.

In the prior art complementary symmetry field-effect transistor (FET) amplifier of FIG. 1, input terminal 10 is coupled to control electrode 12 of P - type field-effect transistor 14 and also to control electrode 16 of N - type field-effect transistor 18. The conduction path of transistor 14 is coupled between circuit point 20 and output terminal 22. Similarly, the conduction path of transistor 18 is coupled between circuit point 24 and output terminal 22.

In operation, circuit point 20 receives an operating potential $V_2$ which is relatively positive compared to an operating potential $V_1$ supplied to circuit point 24. It is known that field-effect transistors, connected as shown, behave in a manner generally analogous to voltage controlled resistors. For example, if transistor 18 is an N - type enhancement-mode field-effect transistor the resistance of its conduction path will tend to decrease as an increasing voltage (which is greater than $V_1$) is applied to control electrode 16. Conversely, if transistor 14 is a P - type enhancement mode field-effect transistor the resistance of its conduction path to decrease with a decreasing voltage (less than $V_2$) is applied to control electrode 12. Since control electrodes 12 and 16 are both connected to input terminal 10 the resistances of the conduction paths of transistors 14 and 18 vary in a complementary fashion in a response to an input signal $V_{in}$ applied to input terminal 10. The potential at output terminal 22 is determined by the ratio of the resistances of the conduction paths of transistors 18 and 14 and by the magnitude of the potentials applied to circuit points 24 and 20.

Figure 2:
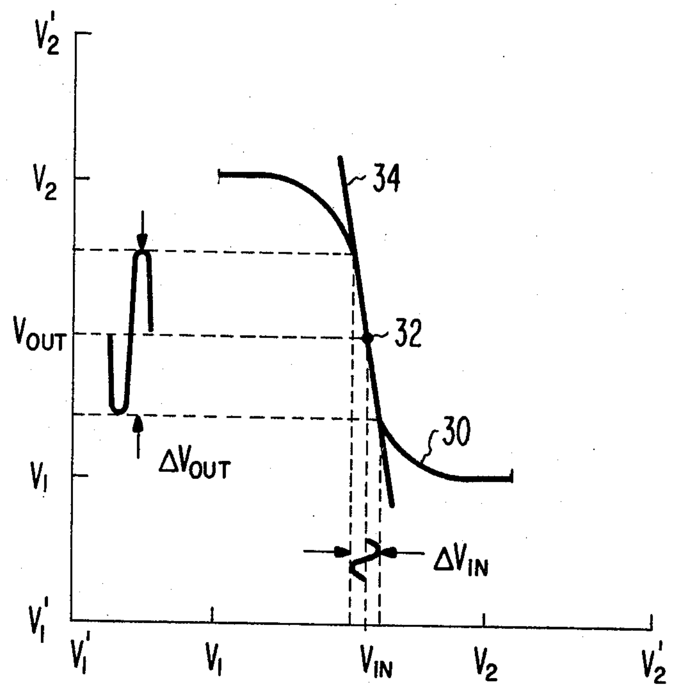
FIG. 2 illustrates a typical transfer function associated with the prior art amplifier of FIG. 1.

FIG. 2 illustrates in more detail the relationship between the input and output signals of the prior art amplifier of FIG. 1. The output voltage produced at terminal 22, $V_{out}$, is seen to vary in accordance with voltage applied to input terminal 10, $V_{in}$, as is illustrated by typical transfer function 30. From the figure, it is seen that if $V_{in}$ includes a small component $\Delta V_{in}$, the prior art amplifier will produce an output signal which includes a component $\Delta V_{out}$ that is an inverted and amplified representation of $\Delta V_{in}$.

It is to be noted further from FIGS. 1 and 2 that the output voltage $V_{out}$ is bounded by the potentials $V_1$ and $V_2$ applied to circuit points 24 and 20, respectively. The maximum voltage gain of the amplifier is related to the location of operating point 32 which, in the quiescent state of the amplifier, is determined by the value of $V_{in}$, the magnitude of the operating potentials ($V_1$, $V_2$) and the shape of transfer function 30. The slope represented by line 34 of transfer function 30 at operating point 32 is a measure of the amplifier's gain and is typically a maximum when the quiescent value of the output voltage is located nominally midway between potentials $V_1$ and $V_2$. This condition also represents a condition of maximum dynamic range for the prior art amplifier.

The circuit of FIG. 3 incorporates a pair of the prior art amplifiers (40, 42) of FIG. 1 wherein similar reference numbers designate like reference elements. Operating potential terminals **20*a* and 24*a* of amplifier 40 are coupled to circuit points 44 and 43, respectively, as are operating potential terminals 20*b* and 24*b* of amplifier 42. A first variable impedance circuit 46 includes two P - type transistors (48, 50) having their conduction paths coupled between circuit point 44 and circuit point 52. Control electrodes 54 and 56 of transistors 50 and 48, respectively, are coupled to output terminals 22*b* and 22*a*, respectively. A second variable impedance circuit 58 includes N - type transistors 60 and 62 the conduction paths of which are coupled between circuit point 43 and circuit point 64. Control electrodes 66 and 68 of transistors 62 and 60 respectively are coupled to output terminals 22*b* and 22*a***, respectively.

Operation of the invention as embodied in the circuit of FIG. 3 is complex due to an interactive feedback relationship between the two amplifiers. Each amplifier receives a common set of operating potentials ($V_1$, $V_2$) which are controlled by the outputs of both amplifiers. Each amplifier output signal therefore is a function of three variables: (1) its input signal, (2) its output signal and (3) the output signal produced by the other amplifier. The circuit input signals, applied to terminals **10*a* and 10*b***, include a common-mode voltage, $V_{cm}$, under quiescent operating conditions and additionally include differential mode signals ($S_1$, $S_2$) under dynamic operating conditions.

In the following analysis of the interactive feedback relationships between amplifiers 40 and 42 of the present invention, it is helpful to keep in mind the dual nature of the problem to be solved. That problem is one of amplifying differential signal components and rejecting common-mode components of the input signals. In particular, it is desired to maximize the amplifiers gain with respect to the differential signals over a wide common-mode.

Response to Common-Mode Input Signals

The ability of a differential amplifier to reject signals common to its input terminals is known as the common-mode rejection (CMR) capability of the amplifier and the ratio of the CMR to the differential voltage gain of the amplifier is known as the common-mode rejection ratio (CMRR). Both the CMRR and the voltage range over which an amplifier produces substantial amounts of common-mode rejection represent important figures of merit for differential amplifiers. The latter parameter is customarily referred to as the common-mode input voltage range of the amplifier.

Common-mode rejection in the present invention is achieved by feeding back the output signals produced at terminals **22*a* and 22*b*, to variable impedance circuits 46 and 58. These circuits effectively translate the operating potentials $V_1$ and $v_2$ (which are common to amplifiers 40 and 42) in such a sense as to counteract changes in the output signals of the amplifiers and maintain the output signal of each amplifier approximately centered between $V_1$ and $V_2$. As previously discussed, this bias condition tends to maximize the voltage gain and dynamic range of amplifiers 40 and 42**.

In the following detailed discussion, assume that circuit point 64 is maintained at a fixed operating potential such as ground, and that circuit point 52 is maintained at a fixed positive potential. Assume initially that input terminals **10*a* and 10*b* each receive input signals which include a common-mode voltage equal to half of the potential applied to circuit point 52. Assume also that amplifiers 40 and 42** have substantially similar transfer functions.

Under these conditions, amplifiers 40 and 42 will each produce a similar output voltage, $V_o$, at their respective output terminals 22*a* and 22*b*. This output voltage will lie within the limits of $V_1$ and $V_2$ as previously discussed and represents a bias voltage common to the control electrodes of each of transistors 48, 50, 60, and 62. If transistors 48 and 50 are P - type enhancement-mode devices, the resistance of their conduction paths will tend to increase for increasing values of $V_o$ thus raising the impedance between circuit points 52 and 44 and decreasing the value of $V_2$ (making it less positive). Simultaneously, if transistors 60 and 62 are N - type enhancement mode devices, the resistance of their conduction paths will tend to decrease, lowering the impedance between circuit points 43 and 64 and thus decreasing the value of $V_1$. The effect is that for increasing values of $V_o$, the impedance of the variable impedance circuits 46 and 58 vary in a complementary fashion to translate operating potentials $V_1$ and $V_2$ in the same sense — both become relatively lower. Conversely, for decreasing values of $V_o$, variable impedance circuits 46 and 58 adjust their respective impedances to translate operating potentials $V_1$ and $V_2$ to relatively more positive values.

Since the output voltage $V_o$ produced by each amplifier is inversely related to the common-mode input voltage, $V_{cm}$, applied to each amplifier, it follows that the effect of the variable impedance circuits, connected as described, is to translate operating potential $V_1$ and $V_2$ in the same sense as the common-mode input voltage. The purpose of this voltage translation is to effectively maintain output terminals 22*a* and 22*b* approximately "centered" within linear regions of their transfer functions for wide variations in the common-mode input voltage as indicated in FIG. 3*a*.

FIG. 3a further shows that the amplifier of FIG. 3 has a linear operating region bounded by minimum and maximum common mode voltage limits. These voltage limits are principally determined by saturation and threshold effects associated with transistors 48, 50, 60, and 62. Within the linear operating region, it is seen that if the common-mode input voltage decreases by an increment $\Delta V_{cm}$, the output voltage will increase by an increment $\Delta V_o$. The ratio $\Delta V_o/\Delta V_{cm}$, represents the common-mode voltage gain of the amplifier and is inversely related to the effective transconductances of the variable impedance circuits 46 and 58. Ideally, the effective transconductances of the variable impedance circuits would be made as high as practical to minimize the common-mode voltage gain of the amplifier in order to obtain higher common-mode rejection ratios for given values of differential voltage gain.

Response to Differential Mode Input Signals

Assume that terminals 10*a* and 10*b* receive input signals $V_{cm} + S_1$ and $V_{cm} + S_2$ respectively, where $S_1$ and $S_2$ represent balanced differential signals ($S_2 = -S_1$). Under these conditions, amplifiers 40 and 42 are biased to a quiescent operating condition in response to $V_{cm}$ as previously described. To a first approximation (under small signal conditions) the operating potentials $V_1$ and $V_2$ will remain relatively unaffected by the presence of the differential signals. The reason for this is that as signal $S_1$ increases, the potential at output terminal 22a decreases which decreases the resistance of the conduction path of transistor 48 and increases that of transistor 60. Simultaneously signal $S_2$ decreases causing an increase in the potential at terminal 22*b*. If amplifiers 40 and 42 have substantially similar transfer functions, the potential at terminal 22*b* will increase by an increment equal to the decrease in potential at terminal 22*a*. This signal causes the resistance of the conduction path of transistor 54 to increase and that of transistor 62 to decrease.

Under small signal conditions, the decreased resistance of transistor 48 will be substantially offset by the increased resistance of transistor 50 so that the parallel equivalent resistance between circuit points 52 and 44 will tend to remain constant. Similarly, the increased resistance of transistor 60 will be substantially offset by the decreased resistance of transistor 62 so that the parallel equivalent resistance between circuit points 43 and 64 will also remain substantially constant. Since the equivalent impedances of the variable impedance circuits remain substantially constant, it follows that the operating potentials, $V_1$ and $V_2$, will be relatively unaffected by the differential input signals.

A similar situation obtains when unbalanced differential mode signals are applied to input terminals 10*a* and 10*b*. Assume, for example, that input terminals 10*a* and 10*b* receive input signals of $V_{cm} + \Delta V$ and $V_{cm}$, respectively. The additional voltage, $\Delta V$, at terminal 10*a* will produce an increment of decreased voltage at terminal 22*a* which will decrease the resistance of the conduction path of transistor 48 and increase that of transistor 60. These changes will tend to increase potentials $V_2$ and $V_1$ and thus the voltage at output terminal 22*b* will tend to increase also. As this voltage increases it will tend to decrease the resistance of the conduction path of transistor 62 and increase that of transistor 50 which, in turn, will tend to counteract the effect of the changes which occurred in the resistance of the conduction paths of transistors 48 and 60.

Assuming substantially equal transconductances for transistors 48, 50, 60 and 62, an equilibrium condition will be reached where the increment of decrease of voltage at output terminal 22*a* will be substantially equal to an increment of increased voltage at output terminal 22*b*. Thus, the circuit of FIG. 3 would be suitable for producing differentially related output signals in response to a single input signal. Such a circuit would be useful, for example, in signal transmission applications where it is desired to drive a balanced line from an unbalanced source.

In FIG. 4, additional pairs of P - type and N - type transistors are employed in the variable impedance circuits of FIG. 3 for providing increased feedback gain. Parallel connected transistors 48 and 50 are coupled in series with parallel connected transistors 48' and 50' which are further coupled in series with parallel connected transistors 48'' and 50'' The series combination is coupled between circuit points 44 and 52 with the control electrodes 56, 56' and 56'' coupled to output terminal 22*a* and control electrodes 54, 54' and 54'' coupled to output terminal 22*b*. Parallel connected transistors 60 and 62 are connected in series with parallel connected transistors 60' and 62'. The series combination is coupled between circuit points 43 and 64. Control electrodes 68 and 68' are coupled to output terminal 22*a* and control electrodes 66 and 66' are coupled to output terminal 22*b*.

Operation of the circuit of FIG. 4 is similar to that of the circuit of FIG. 3 except that the additional pairs of transistors in each of the variable impedance circuits provides enhanced transconductance for reducing the common-mode voltage gain of the differential amplifier to thus increase the common-mode rejection ratio.

FIG. 4 also differs from FIG. 3 in that different numbers of pairs of transistors are employed in the two variable impedance circuits. This may be desirable in some applications to obtain a more uniform correspondence between the operating characteristics of the two variable impedance circuits. This need may arise, for example, if transconductances of the P - tyep transistors differ appreciably from that of the N - type transistors. Of course, in a given design, other techniques may be used to provide uniform operating characteristics for the variable impedance circuits. For example, the carrier mobilities or channel lengths of the P - type and N - type transistors may be varied to achieve similar transconductances in the different types of transistors. Thus the variable impedance circuits may be either symmetrical or asymmetrical depending upon design parameters of the P - type of N - type transistors.

The circuit of FIG. 5 illustrates the use of series connected transistors within each of the variable impedance circuits rather than the parallel connected transistors shown in FIG. 3. In variable impedance circuit 46 the conduction paths of transistors 50 and 48 are connected in series between circuit points 52 and 44. The conduction paths of transistors 62 and 60 are connected in series between circuit points 43 and 64. Control elecrodes 56 and 68 are coupled to output terminal **22*a* and control electrodes 66 and 54 are coupled to output terminal 22*b*.**

Operation of the circuit of FIG. 5 is similar to that of the circuit of FIG. 3 with the exception that the series connected transistors represent an equivalent resistance equal to the sum of the resistances of the conduction paths of the individual transistors. The series connected transistors, therefore, may provide a more constant equivalent impedance than the parallel connected transistors of FIG. 3 in response to balanced differential-mode imput signals applied to input terminals **10*a* and 10*b* of the amplifiers 40 and 42,** respectively.

It will be appreciated that each of the circuits shown has a dual obtained by reversing the transistor types and relative power supply potentials. Although the variable impedance circuits have been shown separately in series and parallel configurations, other arrangements such as seriesparallel may be employed in each variable impedance circuit or one variable impedance circuit may utilize series connected transistors while the other employes parallel connected transistors. Further, it is not necessary that the same number of transistors be included in the two variable impedance circuits. Finally, although field-effect transistors have been shown in the variable impedance circuits, other suitable transistor types may be employed to accomplish the variable impedance function of circuit elements 46 and 58. It will also be appreciated that additional non-inverting amplifier stages may be included within the feedback paths between the output terminals and the control electrodes of the transistors within the variable impedance circuits to provide increased feedback gain. Similarly, amplifiers 40 and 42 (FIG. 3) may include multiple stages of cascade connected pairs of complementary field-effect transistors to provide higher differential voltage gains.

What is claimed is:

1. In combination:

first and second circuit points;

first and second amplifiers, each having an input terminal, an output terminal, a P-type field-effect transistor and an N-type field effect transistor, each transistor having a conduction path and a gate electrode, the gate electrode of each transistor of the first amplifier being coupled to the input terminal of that amplifier and the gate electrode of each transistor of the second amplifier being coupled to the input terminal of the second amplifier, the conduction path of the P-type transistor of each amplifier being coupled between said first circuit point and the output terminal of that amplifier, and the conduction path of the N-type transistor of each amplifier being coupled between said second circuit point and the output terminal of that amplifier;

first and second operating voltage terminals;

at least a first pair of semiconductor devices, each device thereof having a conduction path of P conductivity type connected between said first circuit point and said first operating voltage terminal and at least a second pair of semiconductor devices, each device thereof having a conduction path of N conductivity type connected between said second circuit point and said second operating voltage terminal, each semicondutor device of each pair having a control electrode for controlling the conduction of its path; and means coupling the output terminal of the first amplifier to the control electrode of one semiconductor device of each pair of said devices and means coupling the output terminal of the second amplifier to the control electrode of the other semiconductor device of each pair of said devices.

2. The combination recited in claim 1 wherein the conduction paths of said one pair of semiconductor devices are connected in parallel between said first circuit point and said first operating voltage terminal and wherein the conduction paths of said second pair of semiconductor devices are connected in parallel between said second circuit point and said second operating voltage terminal.

3. The combination recited in claim 1 wherein the conduction paths of said one pair of semiconductor devices are connected in series between said first circuit point and said first operating voltage terminal and wherein the conduction paths of said second pair of semiconductor devices are connected in series between said second circuit point and said second operating voltage terminal.

4. The combination recited in claim 1 further comprising means for applying input signals to said input terminals, each of said input signals including a common-mode voltage component and a differential-mode voltage component, the differential mode voltage component of one of said signals being substantially of equal magnitude and opposite phase relative to the differential-mode voltage component of the other of said signals.

5. The combination recited in claim 1 further comprising means for applying input signals to said input terminals, said input signals including common-mode voltage components and unbalanced differential-mode voltage components.

6. In combination:

first and second circuit points for receiving first and second voltages, respectively, one of said voltages being more positive than the other;
third and fourth circuit points;
first and second controllable impedance means, the first connected between said first and third circuit points and the second connected between said second and fourth circuit points;
first and second amplifiers, each amplifier having an input terminal for receiving an input signal, an output terminal for producing an output signal, and first and second operating voltage terminals for receiving an operating voltage thereacross, said first operating voltage terminal of each of said amplifiers being connected to said third circuit point and said second operating voltage terminal of each of said amplifiers being connected to said fourth circuit point; and
means responsive to a change in the same sense of said output signals at said output terminals for changing the impedance of said first controllable impedance means in one sense and changing the impedance of said second controllable impedance means in the opposite sense.

7. The combination as set forth in claim 6, wherein said first amplifier comprises first and second field-effect transistors of complementary conductivity type, and said second amplifier comprises third and fourth field effect transistors of complementary conductivity type, each transistor having a control electrode and a conduction path, the conduction paths of said first and second transistors being connected in series between said first and second operating voltage terminals of said first amplifier and the conduction paths of said third and fourth transistors being connected in series between said first and second operating voltage terminals of said second amplifier;
the control electrodes of said first and second transistors being connected to said input terminal of said first amplifier and the control electrodes of said third and fourth transistors being connected to said input terminal of said second amplifier; and
the connection between the conduction paths of said first and second transistors being connected to said output terminal of said first amplifier and the corresponding connection of said third and fourth transistors being connected to said output terminal of said second amplifier.

8. The combination recited in claim 7 wherein said first and second controllable impedance means comprises:
first and second sets of transistors, respectively, those of the first set coupled between said first and third circuit points for controlling the impedance therebetween; those of the second set coupled between said second and fourth circuit points for controlling the impedance therebetween, a selected transistor of each set controlled by signals present on one of the output terminals and a different selected transistor of each set controlled by signals present on the other of the output terminals.

9. The combination recited in claim 8, wherein said first set of transistors comprise two field effect transistors, each having a conduction path of a first conductivity type and a control electrode for controlling the conductivity of the path, said paths coupled in parallel between said first and third circuit points, the control electrodes each coupled to separate ones of said output terminals.

10. The combination recited in claim 9 wherein said second set of transistors comprises two field-effect transistors, each having a conduction path of a second conductivity type and a control electrode for controlling the conductivity of the path, said paths coupled in parallel between said second and fourth circuit points, the control electrodes each coupled to separate ones of said output terminals.

11. The combination recited in claim 10 wherein a selected one of said sets of transistors includes an additional pair of transistors, each having a conduction path of the same conductivity type as that of the two transistors of the selected set, each additional transistor having a control electrode for controlling the conduction of the path, the paths connected in parallel and the parallel connected paths of the additional pair of transistors connected in series with the parallel connected paths of said two transistors of the selected set, the control electrode of each additional transistor coupled to a separate one of said output terminals.

12. The combination recited in claim 8 wherein said first set of transistors comprises two field effect transistors, each having a conduction path of a first conductivity type and a control electrode for controlling the conduction of the path, the paths coupled in series between said first and third circuit points, the control electrodes coupled to separate ones of said output terminals.

13. The combination recited in claim 12 wherein said second set of transistors comprises two field-effect transistors each having a conductive path of a second conductivity type and a control electrode for controlling the conductivity of the path, the paths coupled in series between said second and fourth circuit points, the control electrodes coupled to separate ones of said output terminals.

14. In combination:
first and second terminals;
control means for applying first and second controllable operating voltages to said first and second terminals, respectively;
two amplifiers, each having an input terminal, an output terminal and two operating voltage terminals, each amplifier connected at one operating voltage terminal to said first terminal and at its other operating voltage terminal to said second terminal, said input terminals of said amplifiers for receiving input signals having a common-mode voltage component and a differential-mode voltage component, said output terminals producing output signals which each change in the same sense for a given change in said common-mode voltage component and which change in opposite senses for a given change in said differential-mode voltage component; and
coupling means connected between said control means and each of said output terminals,
said control means being responsive to said output signals for maintaining said first and second operating voltages substantially constant when said output signals change in opposite senses and for changing the values of both said operating voltages in a sense opposite to that of said output signals when said output signals each change in the same sense.

15. The combination recited in claim 14 wherein each amplifier comprises first and second complementary field-effect transistors, each having a conduction path and a gate electrode for controlling the conduction of its path, the conduction paths of said transistors connected in series between said two operating voltage terminals;

the control electrodes of one of said amplifiers connected to one of said input terminals and the control electrodes of the other of said amplifiers connected to the other of said input terminals; and the connection between the conduction paths of one amplifier connected to one of said output terminals and the corresponding connection of the other amplifier connected to the other output terminal.

16. The combination recited in claim 15 further comprising first and second circuit points for receiving first and second fixed operating potentials, respectively, and wherein said control means comprises:

a first set of transistors, each transistor having a conduction path of a first conductivity type coupled between said first circuit point and said first terminal, and a second set of transistors, each transistor thereof having a conduction path of a second conductivity type coupled between said second circuit point and said second terminal.

17. The combination recited in claim 16 wherein each transistor of said first and second sets of transistors comprises a field-effect transistor having a gate electrode for controlling the conduction of its path and wherein said coupling means comprises:

means coupling one of said output terminals to the gate electrode of one transistor of each set of transistors; and means coupling the other of said output terminals to the gate electrode of the other transistor of each set of transistors.

* * * * *